(12) United States Patent
Sjödin et al.

(10) Patent No.: US 6,538,294 B1
(45) Date of Patent: Mar. 25, 2003

(54) TRENCHED SEMICONDUCTOR DEVICE WITH HIGH BREAKDOWN VOLTAGE

(75) Inventors: Håkan Sjödin, Knivsta (SE); Anders Söderbärg, Uppsala (SE)

(73) Assignee: Telefonaktiebolaget LM Ericson (publ), Stockholm (SE)

(*) Notice: Subject to any disclaimer, the term of this patent is extended or adjusted under 35 U.S.C. 154(b) by 0 days.

(21) Appl. No.: 09/598,172

(22) Filed: Jun. 21, 2000

(30) Foreign Application Priority Data

Jun. 23, 1999 (SE) .............................................. 9902395

(51) Int. Cl.[7] ........................ H01L 29/76; H01L 21/331
(52) U.S. Cl. ...................... 257/409; 257/501; 257/502; 257/508; 257/517; 257/558; 257/593; 438/309; 438/370
(58) Field of Search ................................ 257/513–517, 257/557–564, 501, 508, 502, 593, 409; 438/221, 309, 369, 370, 372–376

(56) References Cited

U.S. PATENT DOCUMENTS

| | | | | |
|---|---|---|---|---|
| 4,214,315 A | * | 7/1980 | Anantha et al. | 257/517 |
| 4,274,909 A | * | 6/1981 | Venkataraman et al. | 438/296 |
| 4,510,676 A | * | 4/1985 | Anantha et al. | 438/324 |
| 4,534,826 A | * | 8/1985 | Goth et al. | 438/421 |
| 4,721,684 A | | 1/1988 | Musumeci | 438/329 |
| 4,857,478 A | * | 8/1989 | Niwano et al. | 438/330 |
| 5,008,210 A | * | 4/1991 | Chiang et al. | 438/345 |
| 5,101,256 A | * | 3/1992 | Harame et al. | 257/565 |
| 5,198,372 A | * | 3/1993 | Verret | 438/330 |
| 5,243,207 A | * | 9/1993 | Plumton et al. | 257/192 |
| 5,294,558 A | * | 3/1994 | Subbanna | 438/359 |
| 5,319,239 A | * | 6/1994 | Ning | 257/585 |
| 5,336,909 A | * | 8/1994 | Katoh et al. | 257/197 |
| 5,340,755 A | * | 8/1994 | Zwicknagl et al. | 438/312 |
| 5,348,905 A | * | 9/1994 | Kenney | 438/247 |
| 5,362,663 A | * | 11/1994 | Bronner et al. | 438/241 |
| 5,485,029 A | * | 1/1996 | Crabbe et al. | 257/501 |
| 5,521,115 A | * | 5/1996 | Park et al. | 438/243 |
| 5,536,961 A | | 7/1996 | Nakagawa et al. | 257/374 |
| 5,592,014 A | | 1/1997 | Funaki et al. | 257/487 |
| 5,656,514 A | * | 8/1997 | Ahlgren et al. | 438/320 |
| 5,801,089 A | | 9/1998 | Kenney | 438/589 |
| 5,886,374 A | * | 3/1999 | Sakamoto et al. | 257/292 |
| 6,071,767 A | * | 6/2000 | Monkowski et al. | 438/202 |

FOREIGN PATENT DOCUMENTS

| | | | |
|---|---|---|---|
| EP | 0 236 632 A2 | 9/1987 | H01L/21/74 |
| EP | 0 497 577 A2 | 8/1992 | H01L/29/06 |

OTHER PUBLICATIONS

R. S. Muller et al., "Device Electronics for Integrated Circuits", 2nd ed., John Wiley & Sons, 1977, pp. 11–15.*

* cited by examiner

Primary Examiner—George Eckert
Assistant Examiner—José R. Diaz
(74) Attorney, Agent, or Firm—Nixon & Vanderhye, PC

(57) ABSTRACT

An arrangement in a semiconductor component includes a highly doped layer on a substrate layer and is delimited by at least one trench extending from the surface of the component through the highly doped layer. A sub-layer between the substrate layer and the highly doped layer is doped with the same type of dopant as the buried collector, but to a lower concentration. The sub-layer causes a more even distribution of the potential lines in the substrate and in a sub-collector layer, thereby eliminating areas of dense potential lines and increasing the breakdown voltage of the component, (i.e., because the breakdown voltage is lower in areas with dense potential lines).

8 Claims, 5 Drawing Sheets

TRENCHED SEMICONDUCTOR DEVICE WITH HIGH BREAKDOWN VOLTAGE

TECHNICAL FIELD

The present invention relates to semiconductor component arrangements and in particular to isolation techniques for such arrangements.

BACKGROUND

Two main methods exist today for achieving isolation of an Integrated Circuit (IC) component on a chip: junction isolation and Silicon on Insulator (SOI).

In the junction isolation technique, a reverse voltage is applied from the component to a surrounding isolation area and to the substrate. Normally the substrate and the isolation are connected. This technique has several drawbacks, such as leakage currents to the substrate, and the formation of parasitic transistors. Also, the higher the voltage of the components, the thicker the epitaxial layer must be. Since the isolation area must extend through the whole epitaxial layer, for high-voltage components, the isolation areas also become wide, making the component as a whole unnecessarily large.

In SOI technology the components are placed on an insulating oxide layer and are isolated from each other by means of trenches. This reduces the size of the component compared to junction isolation techniques by up to 50%, sometimes even more. The main drawbacks are the price of the SOI wafer as a starting material and the thermal insulation caused by the oxide layer. The thermal insulation results in a higher temperature of the component, which may affect the life span of the component, and there is a risk of the components being destroyed in thermal runaway.

A third method is to apply isolating trenches to bulk silicon. In low-voltage applications this method is used to save space or to improve the frequency performance of the components. The trench walls are usually covered by an insulator such as an oxide, and the rest of the trench is filled with polysilicon.

For high-voltage components of this kind the breakdown voltage tends to be too low.

OBJECT OF THE INVENTION

It is an object of the present invention to improve the performance of high voltage semiconductor components using trenches on bulk silicon.

SUMMARY OF THE INVENTION

This object is achieved according to the invention by an arrangement in a semiconductor component including a highly doped layer on a substrate layer and is delimited by at least one trench extending from the surface of the component through the highly doped layer. A sub-layer between the substrate layer and the highly doped layer is doped with the same type of dopant as the buried collector, but to a lower concentration.

The object is also achieved according to the invention by a method of manufacturing a semiconductor component comprising a highly doped layer on a substrate layer, comprising the steps of doping a sub-collector layer in the substrate layer,
doping a buried collector in the substrate layer using the same type of dopant as in the sub-collector layer,
forming at least one trench in the component, said trench extending from the surface of the component into the substrate layer.

Alternatively, the method may comprise the following steps:

epitaxially growing a sub-layer on a substrate layer, said sub-layer being lightly doped with the opposite type of dopant of the substrate layer, epitaxially growing a highly doped layer on the sub-layer, etching at least one trench in the component, said trench extending from the surface of the component into the substrate layer.

The sub-layer causes a more even distribution of the potential lines in the substrate and in the sub-collector layer, thereby avoiding areas of particularly dense potential lines. Since the breakdown voltage is lower in areas with dense potential lines, avoiding too dense potential lines means increasing the breakdown voltage of the component.

The term "type of dopant" refers only to n-type or p-type, respectively. The actual dopant used in the highly doped layer and the sub-layer does not have to be the same.

Preferably, the highly doped layer is a part of the collector covered by a lightly doped epitaxial layer. Areas to form the bipolar components, such as a base, a collector and an emitter may then be formed in the epitaxial layer. In the same way, MOS components or diodes could be formed using the buried layer as a part of the drain or the anode, respectively. If the highly doped layer is at the surface of the component, and does not cover the whole component, it may be used as the source and drain of a lateral MOS component, or a diode may be formed.

A suitable top concentration of the dopant used in the sub-layer lies in the range of $5 \cdot 10^{15}$ ions/cm$^3$–$10^{17}$ ions/cm$^3$. A preferred depth of the sub-layer is between 2 $\mu$m and 10 $\mu$m below the highly doped area, that is, the distance from the depth where the sub-layer dopant begins to exceed the collector doping profile down to the pn junction between the sub-layer and the substrate layer is preferably between 2 $\mu$m and 10 $\mu$m.

The semiconductor component according to the invention preferably comprises an area doped with the opposite type of doping of the highly doped layer, surrounding the bottom of each trench, but not in contact with the sub-collector layer.

This area is introduced to increase the threshold voltage to avoid the forming of leaking parasitic MOS components by the n+-doped buried collector layer on both sides of the trench.

The polysilicon should have approximately the same potential as the substrate so that there will be no leakage currents from the parasitic MOS transistor. To achieve this, the trench walls may be covered with an oxide layer and the interior of the trench is filled with polysilicon, the polysilicon being in electrical contact with the substrate layer. Electrical contact between the polysilicon of the trench and the substrate layer may be achieved by means of a surface contact, or by a hole in the oxide layer at the bottom of the trench. Alternatively, the polysilicon in the trench and the substrate layer may be connected to the same potential outside the chip.

Suitable dopants for the highly doped layer are arsenic or antimony, which are slow diffusing dopants.

A suitable dopant for the sub-layer is phosphorus, which is a fast diffusing dopant. If a fast diffusing dopant is used, the sub-layer may be doped at the same time as the highly doped layer, or before, or even after, it.

Arsenic or antimony may also be used as the dopant in the sub-layer. In this case the sub-layer may be doped before the highly doped area, since the dopants for the sub-layer have to diffuse further into the substrate.

It is feasible to connect the trench delimiting the component to at least one other trench delimiting at least one other component. In this way, if surface contacts are used to make the potential of the trench close to the potential of the substrate layer, all the trenches can be kept at the low voltage using a minimum of contacts.

DETAILED DESCRIPTION OF EMBODIMENTS

Figure 1:
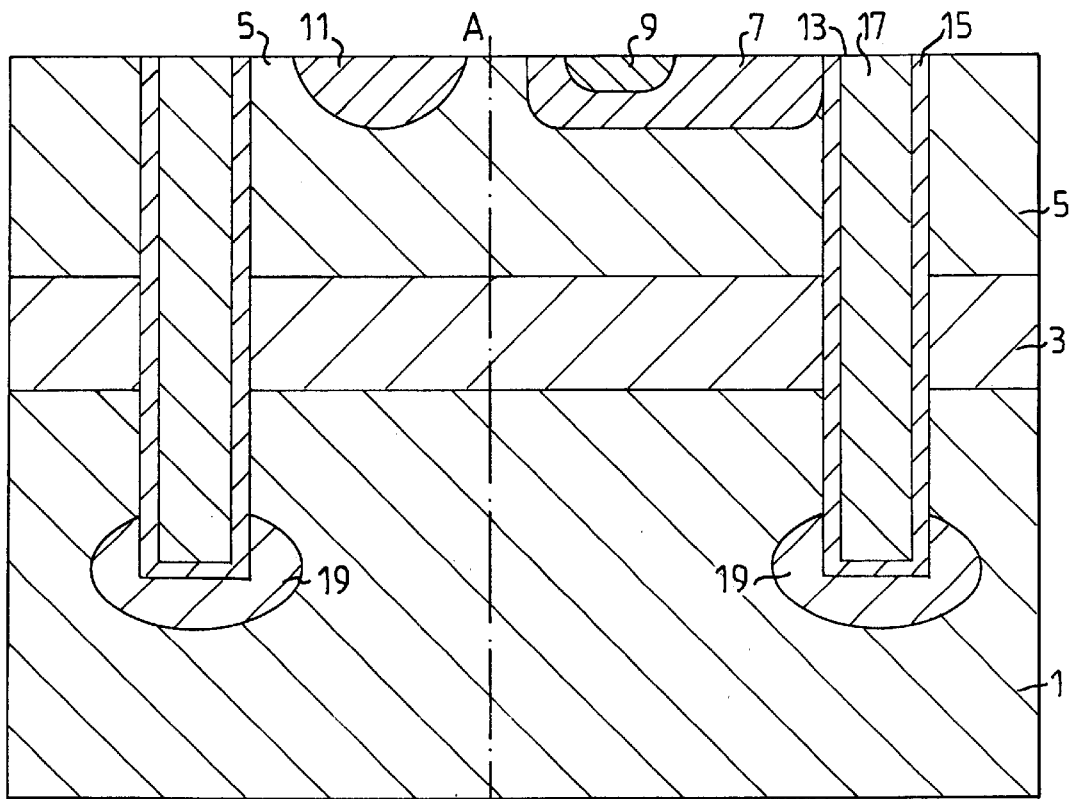
FIG. 1 shows a cross-section of a prior art component

FIG. 1 shows a cross-section of a bulk trenched bipolar transistor according to prior art. On a p type silicon substrate 1 an n-doped layer constitutes a buried collector 3, and on top of the buried collector there is an n– epi layer 5 comprising a p+ doped base 7 with an n+-doped emitter 9. In the epi layer 5 there is also a collector area 11. The component with the base 7, emitter 9 and collector 11 is isolated from surrounding components (not shown) by means of trenches 13. Each trench has an insulating layer 15 covering the walls and bottom, and its interior 17 is filled with polysilicon.

There is a risk of parasitic MOS components being formed by the n+doped buried collector layer on both sides of a trench. For a low voltage component the insulating layer 15 on the trench walls may be sufficient to prevent the forming of parasitic MOS components around the trench. If his is not sufficient, a p+-doped area 19 may be provided at the bottom of the trench to increase the threshold voltage above the feeding voltage of the circuit.

For a high-voltage component, these measures will not be sufficient. Therefore, the whole interior 17 of the trench must be filled with an insulating material, or the polysilicon in the interior of the trench must be connected to the lowest potential found on the chip, which is usually the substrate layer 1. Contact between the interior 17 of the trench and the substrate layer 1 may be achieved by applying a number of contacts at the top of the trench, or by etching a hole through the oxide layer 15 at the bottom of the trench before the polysilicon is applied to the interior of the trench. In these ways the trench is connected to the low potential of the substrate layer 1. As mentioned above, this contact may be made in several different ways. The important thing is that the substrate layer and the polysilicon in the trench have approximately the same potential.

The term "buried collector" refers to a highly doped layer used as a shield for minimizing the substrate currents. It does not necessarily have the function of a collector.

In the part of the substrate layer 1 adjacent to the buried collector 3 a strong electric field is formed, which might reduce the breakdown voltage of the component. This may be prevented by keeping the substrate doping low so that the depletion area can extend deep into the substrate layer. How deep depends on the substrate doping. Near the areas where the trench intercepts the buried collector, a strong electric field will nevertheless arise, and the breakdown voltage will be low. The breakdown voltage can be increased by increasing the thickness of the oxide layer inside the trench, but if the oxide layer is made too thick the mechanical tension caused by the thermal mismatch between the oxide and the silicon will lead to defect generation such as slip lines when the wafer is thermally processed.

Figure 2:
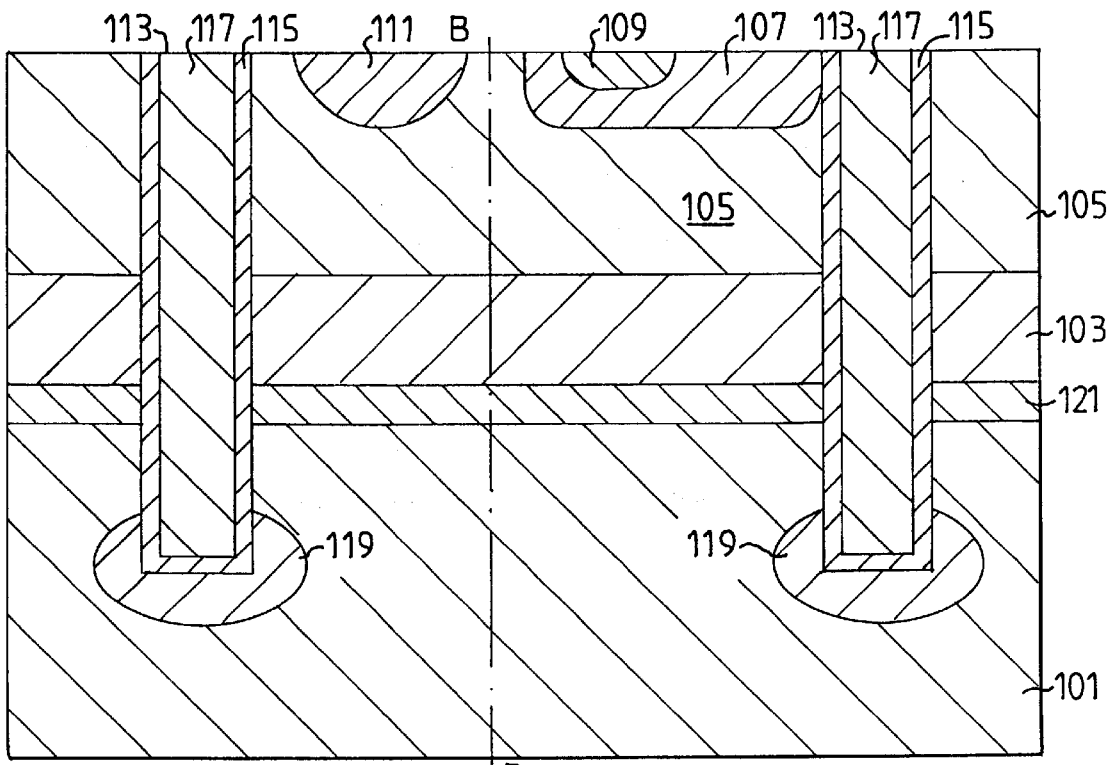
FIG. 2 shows a cross-section of a component according to the invention

According to the invention, the part of the substrate layer just below the buried collector is doped with an n-type dopant, but to a lower concentration than the buried layer 3. The resulting component is shown in FIG. 2.

As before a p type silicon substrate 101 carries an n-doped layer constituting a buried collector 103, and on top of the buried collector there is an n– epi layer 105 comprising a p+-doped base 107 with an n+ doped emitter 109. In the epi layer 105 there is also a collector area 111. The component with the base 107, emitter 109 and collector 111 is isolated from surrounding components (not shown) by means of trenches 113. Each trench has an insulating layer 115 covering the walls and bottom, and its interior 117 is filled with polysilicon. As mentioned above, the whole trench could instead be filled with an insulator, such as an oxide. Optionally, a p+-doped area 119 is provided at the bottom of the trench to increase the threshold voltage above the feeding voltage of the circuit. These p+-doped areas 119 are not needed if the trench is connected to a fixed voltage.

According to the invention, a lightly n-doped sub-collector layer 121 is provided just below the buried collector. As will be shown in FIGS. 3B and 4B, this layer 121 serves to make the potential distribution more even, and thereby to avoid areas of the component in which the breakdown voltage is particularly low, that is, areas that will be particularly vulnerable to breakdown.

Figure 3A:
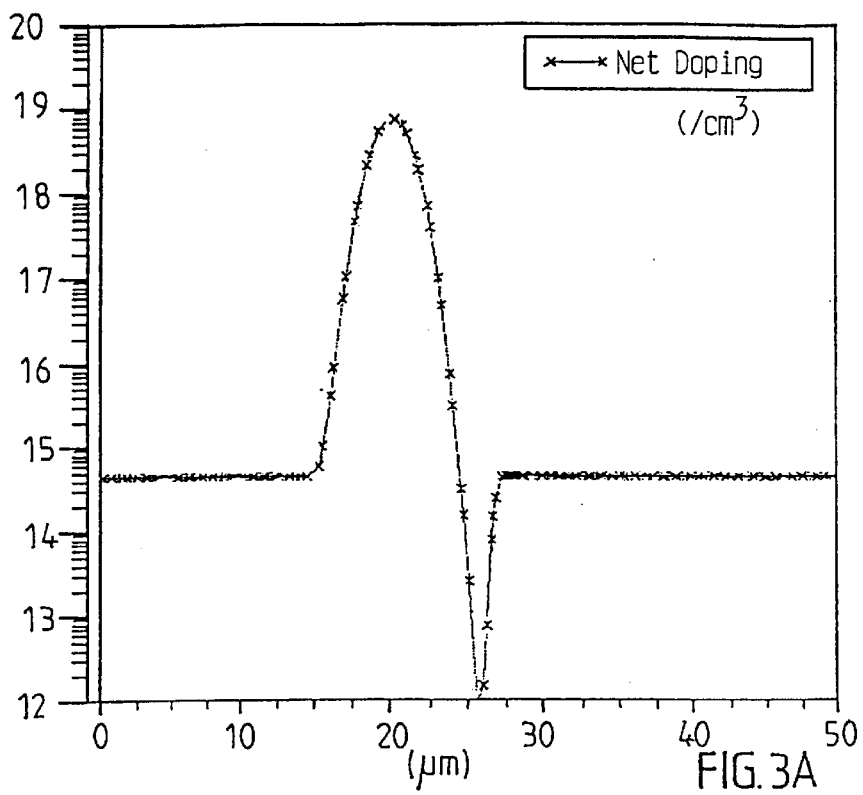
FIG. 3A illustrates schematically the net doping of the component shown in FIG. 1.

FIG. 3A shows, along the horizontal axis, the section indicated by the dotted line A—A of the component shown in FIG. 1. The far left of the curve corresponds to the surface of the epi-layer 5 of FIG. 1, and the far right to the bottom of the substrate layer 1. The vertical axis shows the net doping on a logarithmic scale. As can be seen, the doping is almost constant through the epi-layer down to approximately 16 $\mu$m, where a heavily n-doped area corresponding to the buried collector starts. The n-doped area has a peak at about 20 $\mu$m. At approximately 25 $\mu$m, there is a sharp negative peak, caused by the pn junction between the buried layer 3 and the substrate layer 1.

Figure 3B:
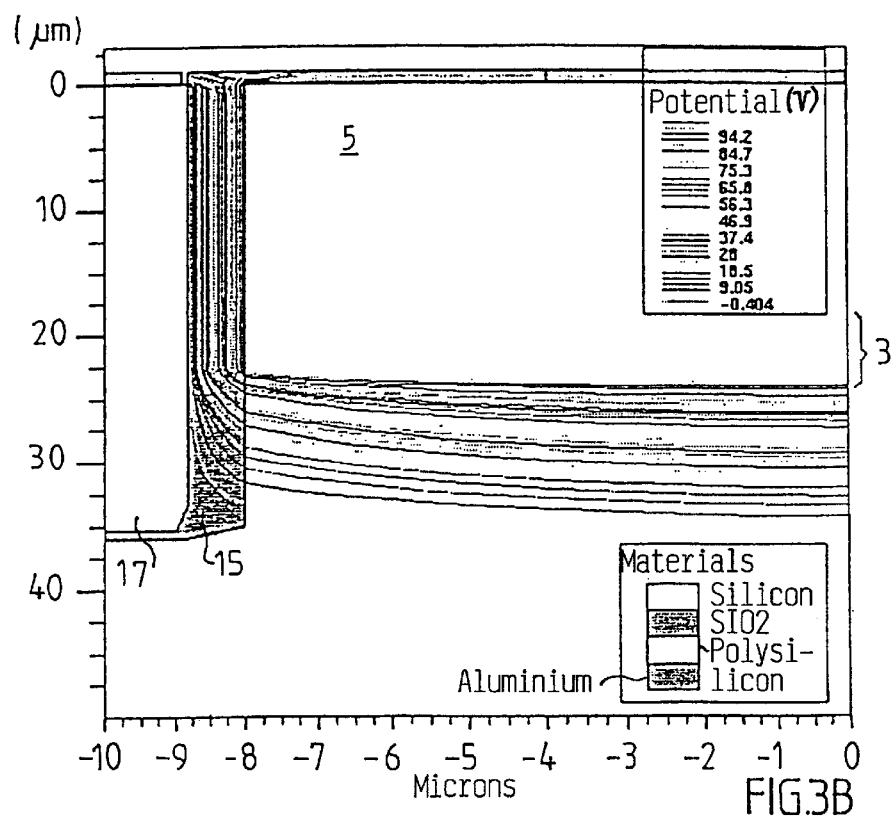
FIG. 3B illustrates the potential distribution of a component like the one shown in FIG. 1.

As a result of this, the potential distribution for the component shown in FIG. 1 will be generally as shown in FIG. 3B. In the left part of FIG. 3B, half a trench is shown, with an insulating layer 15 on the wall, and its interior 17 filled with polysilicon. The polysilicon in the interior 17 of the trench and the substrate 1 are set to the same potential. The n+-layer 3 has a high potential relative to the substrate. The potential lines follow the insulating layer 15 down to the level of the buried collector, indicated by 3, where they bend and extend horizontally in the substrate below the buried collector. Where the potential lines bend, a strong electric field arises, which, in the substrate layer will cause a low breakdown voltage in this area.

Figure 4A:
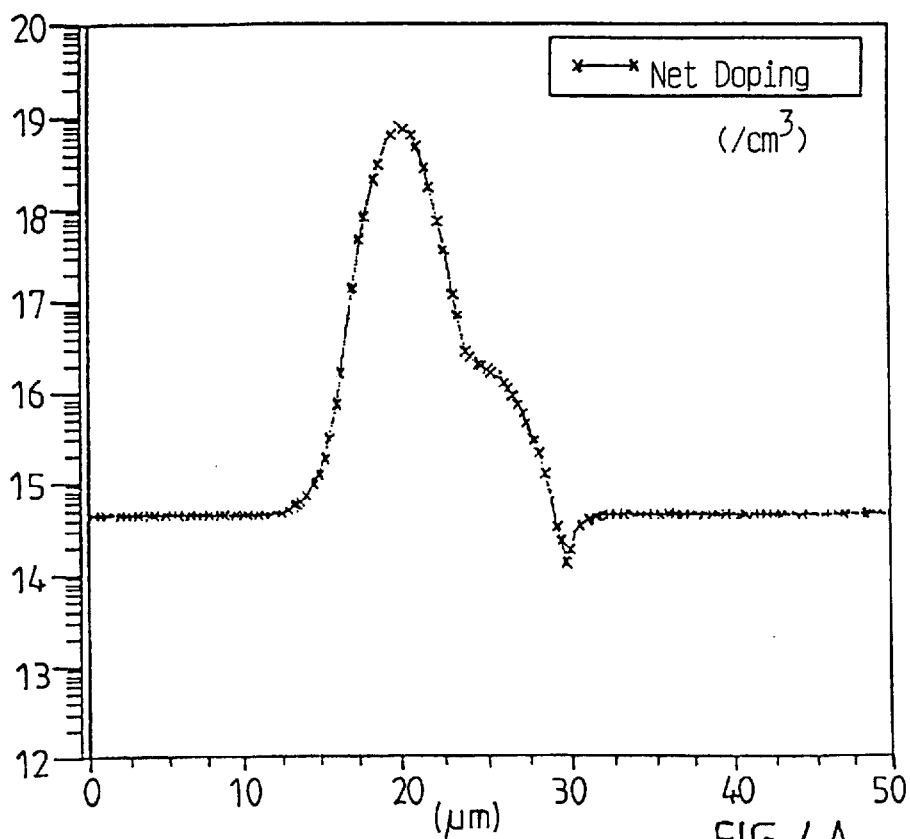
FIG. 4A illustrates schematically the net doping of the component shown in FIG. 2.

FIG. 4A shows, along the horizontal axis, the section indicated by the dotted line B—B of the component shown in FIG. 2. The far left of the curve corresponds to the surface of the epi-layer 105. The far right corresponds to the bottom of the substrate layer 101. The vertical axis shows the net doping on a logarithmic scale. As can be seen, the profile is practically the same as the one shown in FIG. 3A, down to the peak at about 20 μm, corresponding to the buried collector. Below that, the doping decreases less quickly than in FIG. 3A. At approximately 30 μm, there is a negative peak, corresponding to the pn junction between the substrate layer 101 and the sub-collector layer 121.

Figure 4B:
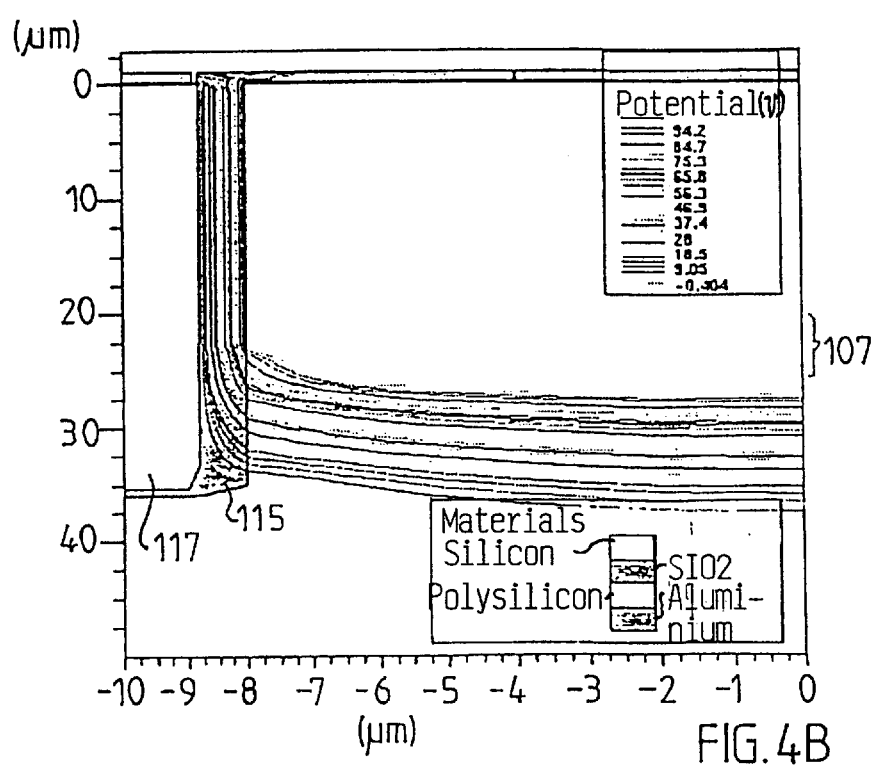
FIG. 4B illustrates the potential distribution of a component like the one shown in FIG. 2.

The resulting potential distribution is shown in FIG. 4B. In the left part of FIG. 4A, half a trench is shown, with an insulating layer 115 on the wall, and its interior 117 filled with polysilicon. The potential lines follow the insulating layer 115 down to the level of the buried collector, indicated by 103, where they bend and extend horizontally in the n-doped layer of the substrate below the buried collector As can be seen, compared to FIG. 3B, the potential lines of FIG. 4B are smoother and more evenly distributed, meaning that the critical electrical field strength will not be reached until the voltage applied is fairly high. This shows that the breakdown voltage of the component according to the invention, shown in FIG. 2, will be significantly higher than of the prior art component shown in FIG. 1.

Figure 5:
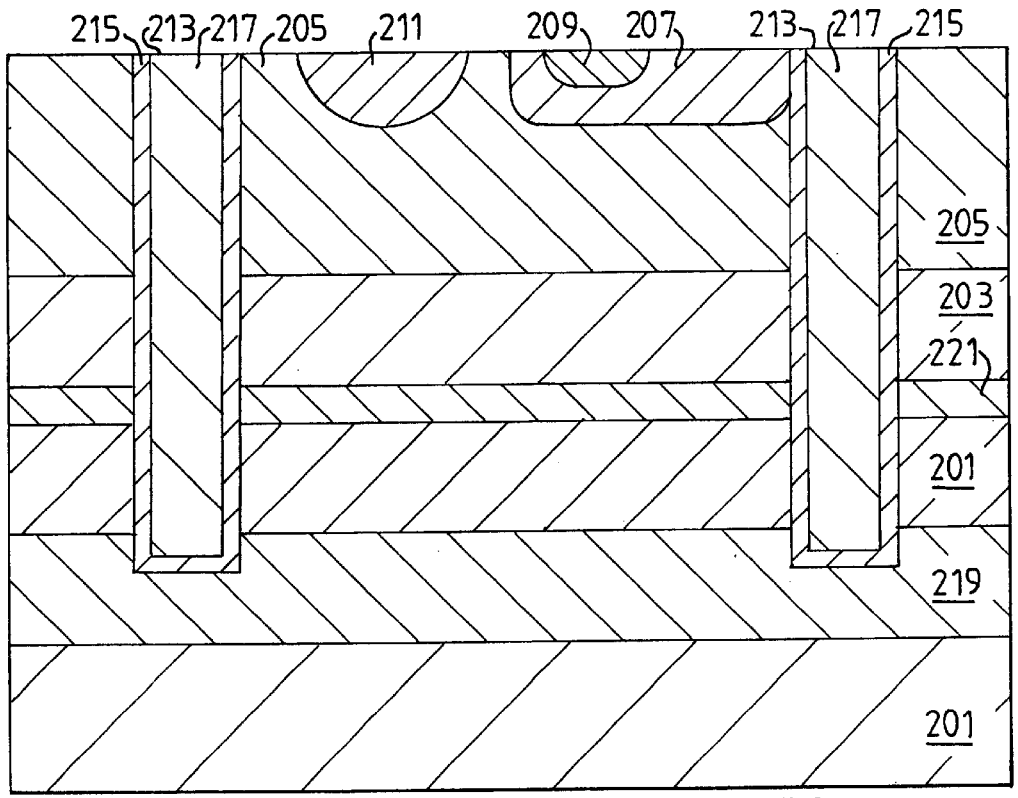
FIG. 5 illustrates a component according to second embodiment of the invention

FIG. 5 shows an alternative embodiment in which the p+-doped area at the bottom of the trench has been replaced with a continuous p+-doped layer. As in FIG. 2, there is a p type silicon substrate 201 carrying an n-doped layer constituting a buried collector 203, and on top of the buried collector there is an n- epi layer 205 comprising a p+-doped base 207 with an n+ doped emitter 209. In the epi layer 205 there is also a collector area 211. The component with the base 207, emitter 209 and collector 211 is isolated from surrounding components (not shown) by means of trenches 213. Each trench has an insulating layer 215 covering the walls and bottom, and its interior 217 is filled with polysilicon. As mentioned above, the whole trench could instead be filled with an insulator, such as an oxide. Instead of the p+-doped area 119 in FIG. 2, a p+-doped layer 219 is provided in the substrate layer 201 at such a level the bottom of the trench 213 reaches into it. The p+-doped layer serves to increase the threshold voltage to avoid the forming of a leaking parasitic MOS component, as explained above. The lightly n-doped sub-collector layer 221 according to the invention is provided just below the buried collector.

Figure 6:
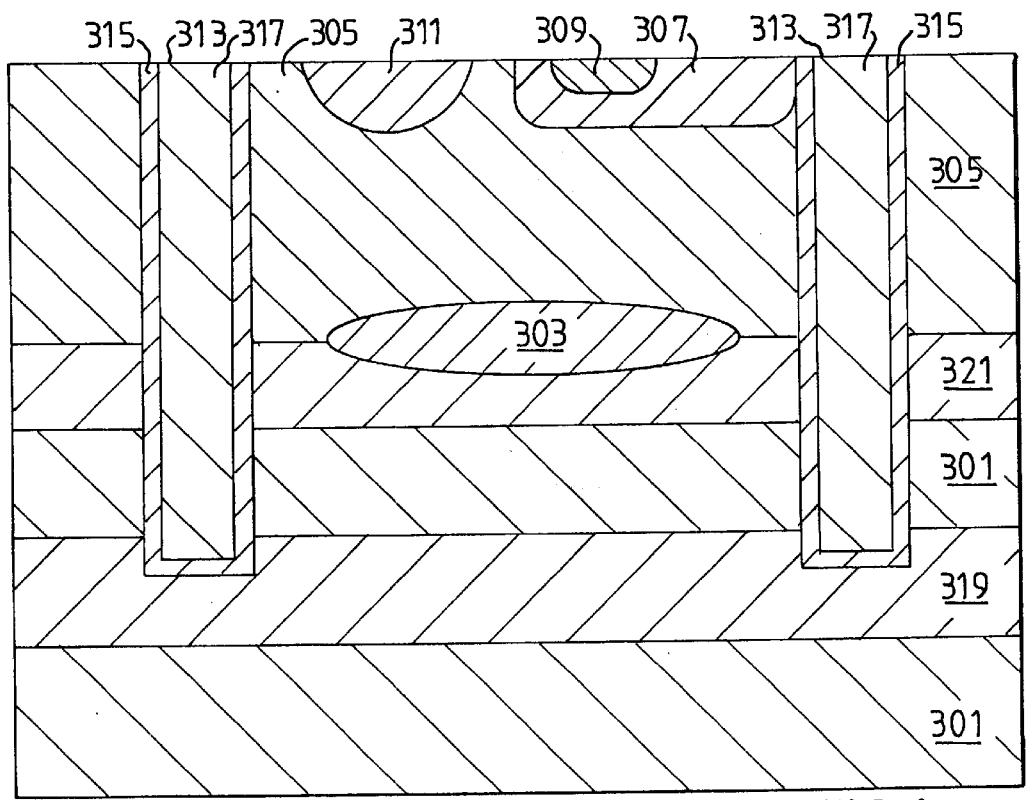
FIG. 6 illustrates a component according to a third embodiment of the invention.

As shown in FIG. 6, the buried collector does not have to extend across the whole component. As in the previous Figures, FIG. 6 shows a p type silicon substrate 301 carrying an n-doped layer constituting a buried collector 303, and on top of the buried collector there is an n- epi layer 305 comprising a p+-doped base 307 with an n- doped emitter 309. In This embodiment, however, the buried collector 303 does not extend over the full component. In the epi layer 305 there is also a collector area 311 The component with the base 307, emitter 309 and collector 311 is isolated from surrounding components (not shown) by means of trenches 313. Each trench has an insulating layer 315 covering the walls and bottom, and its interior 317 is filled with polysilicon. As mentioned above, the whole trench could instead be filled with an insulator, such as an oxide. As in FIG. 5, a p+-doped layer 319 is provided in the substrate layer 301 at such a level the bottom of the trench 313 reaches into it. Obviously, the p+-doped areas (119 in FIG. 2) around the trench bottom could be used instead, or the p+-doped area may not be needed. The lightly n-doped sub-collector layer 321 according to the invention is provided just below the buried collector.

The sub-collector layer 121, 221, 321 introduced according to the invention, may be made at the same time as the buried collector, or before or after the buried collector.

If it is made before the buried collector, a slow diffusing dopant, such as antimony or arsenic may be used. This requires an extra thermal diffusing step, but has the advantage that the doping profile will not change much in subsequent processing steps involving high temperatures. In this case, a substrate 101 is first doped to produce the sub-collector layer 121, then doped again to produce the buried collector 103.

If a fast diffusing dopant, such as phosphorus, is used, the sub-collector layer 121 may be doped at the same time as the buried collector 103, or without thermal processing between the doping of the sub-collector layer 121 and the buried collector 103. By thermal processing is meant processing at temperatures above 800° C. Of course the sub-collector layer 121 may also be doped first, in a similar way as with a slow diffusing dopant, but with a lower temperature and/or shorter time. Using a fast diffusing dopant, the sub-collector layer 121 may also be doped after the buried collector 103.

Regardless of the method chosen, the epitaxial layer 105 is grown on top of the buried collector after the doping of the sub-collector layer 121 and the buried collector 103.

Figure 7:
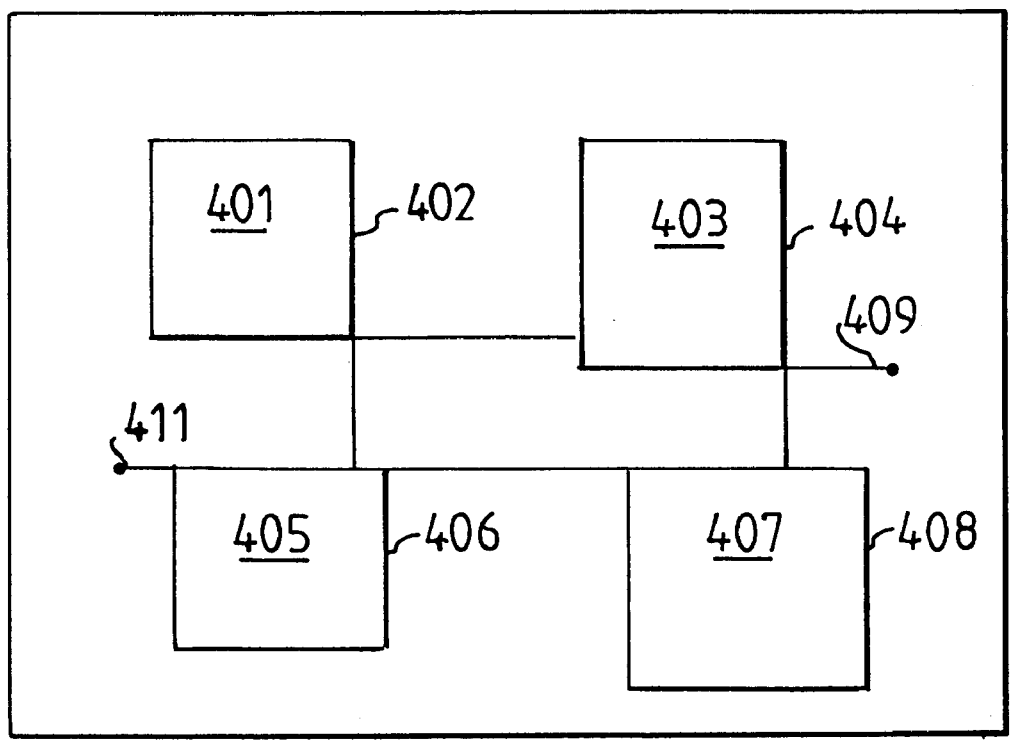
FIG. 7 illustrates a chip comprising several components, according to a preferred embodiment of the invention.

To keep the polysilicon in the interior of the trench at a low potential, the polysilicon in the trench may be in electrical contact with the substrate layer by means of surface contacts. On a chip comprising several components, the number of contacts needed may be reduced if the trenches are connected to each other. FIG. 7 is a view from above of a chip comprising four components 401, 403, 405, 407 each component surrounded by a trench 402, 404, 406, 608, respectively. The trenches of the four components have been interconnected to form an irregular grid, and two contacts 409, 411, only shown schematically, are used to connect all four trenches 402, 404, 406, 408 to the substrate layer. Of course, one contact would be sufficient, but if desired more contacts could be used.

What is claimed is:

1. A semiconductor structure for high voltage semiconductor components, comprising:

a substrate doped at a first concentration level with a first type of dopant;

a sub-layer on the substrate doped at a second concentration level with a second type of dopant opposite to the first type of dopant, the second concentration level being greater than the first concentration level;

a highly-doped layer on the sub-layer and doped with the second type of dopant at a third concentration level higher than the second concentration level;

an epitaxial layer covering the highly-doped layer and doped with the second type of dopant; and at least one trench extending from the surface of the semiconductor structure through the highly-doped layer to delimit the semiconductor structure into plural components, wherein the sub-layer creates an even electrical field distribution in the plural components thereby increasing a breakdown voltage associated with each of the plural components, and wherein a top concentration of the dopant in the sub-layer is in the range of $5 \cdot 10^{15}$ ions/cm$^3$–$10^{17}$ ions/cm$^3$.

2. The semiconductor structure according to claim 1, wherein a thickness of the sub-layer is between 2 μm and 10 μm.

3. The semiconductor structure according to claim 1, comprising an area doped with the opposite type of doping of the highly doped layer, said area surrounding the bottom of each trench, but not in contact with the sub-layer.

4. The semiconductor structure according to claim 1, wherein walls of the trench are covered with an oxide layer and an interior of the trench is filled with polysilicon, the polysilicon being in electrical contact with the substrate layer.

5. The semiconductor structure according to claim 1, wherein the dopant used in the highly doped layer is arsenic or antimony.

6. The semiconductor structure according to claim 1, wherein a dopant used in the sub-layer is phosphor.

7. The semiconductor structure according to claim 1, wherein the dopant used in the sub-layer is arsenic or antimony.

8. The semiconductor structure according to claim 1, wherein the trench is connected to at least one other trench delimiting at least one other component.

* * * * *